United States Patent [19]

Steppan et al.

[11] 3,790,385

[45] Feb. 5, 1974

[54] LIGHT-SENSITIVE DIAZO COPYING COMPOSITION AND COPYING MATERIAL PRODUCED THEREWITH

[75] Inventors: Hartmut Steppan, Wiesbaden-Dotzheim; Fritz Uhlig; Roland Giesse, both of Wiesbaden-Biebrich, all of Germany

[73] Assignee: Kalle Aktiengesellschaft, Wiesbaden-Biebrich, Germany

[22] Filed: July 8, 1971

[21] Appl. No.: 160,912

[30] Foreign Application Priority Data

July 13, 1970 Germany ............................ 2034655

[52] U.S. Cl. .......................... 96/75, 96/33, 96/91 R, 96/115 R, 260/141

[51] Int. Cl. ............................................ G03f 7/08

[58] Field of Search ...... 96/75, 91 R, 33, 115 R, 36, 96/35.1, 36.3

[56] References Cited

UNITED STATES PATENTS

| | | | |
|---|---|---|---|
| 3,396,019 | 8/1968 | Uhlig | 96/75 X |
| 3,235,382 | 2/1966 | Neugebauer et al. | 96/75 X |
| 3,615,532 | 10/1971 | Silver | 96/75 X |
| 3,652,272 | 3/1972 | Thomas | 96/115 R |
| 3,468,725 | 9/1969 | Uhlig | 96/75 X |
| 3,622,333 | 11/1971 | Cope | 96/75 |
| 3,199,981 | 8/1965 | Sus et al. | 96/75 X |
| 3,295,974 | 1/1967 | Erdmann | 96/115 R |
| 3,301,674 | 1/1967 | Uhlig | 96/75 X |
| 3,453,108 | 1/1969 | Delzenne et al. | 96/115 R |
| 3,502,470 | 3/1970 | Delzenne et al. | 96/115 R |

FOREIGN PATENTS OR APPLICATIONS

| | | | |
|---|---|---|---|
| 921,530 | 3/1963 | Great Britain | 96/115 R |

OTHER PUBLICATIONS

Kirk et al., "Encyclopedia of Chem. Tech.," First Supplemental Volume, 1957, p. 312–329.

Kirk et al., "Encyclopedia of Chem. Tech.," 2nd Ed. Vol. 7, p. 263–270, 294, 295, 302.

"Haclch's Chemical Dictionary," 4th Ed., 1969, p. 244 and 481.

"Abstracts of Photo Sci. & Eng. Lit.," Vol. X, 11/1971, Abstract No. 6119–6171P (Teascher–DT 2,024,244 11/26/79 and U.S. Ser. No. 826,297 at pg. 40–41).

*Primary Examiner*—Charles L. Bowers, Jr.
*Attorney, Agent, or Firm*—James E. Bryan

[57] ABSTRACT

This invention relates to a light-sensitive copying composition comprising a condensation product of a light-sensitive diazonium compound in admixture with the reaction product of an organic acid free of olefinic double bonds and an epoxide resin.

28 Claims, No Drawings

LIGHT-SENSITIVE DIAZO COPYING COMPOSITION AND COPYING MATERIAL PRODUCED THEREWITH

The present invention relates to a new light-sensitive negative-working copying composition in liquid form or as a solid layer on a support suitable for reprographic purposes, and preferably serving for the production of printing plates. The copying composition of the invention contains condensation products of benzene diazonium salts in admixture with epoxide resins modified in a specific manner.

Light-sensitive copying material for use in the production of planographic printing plates containing condensates of diazonium salts in admixture with epoxide resins in the light-sensitive layer is known from U. S. Pat. specification No. 3,396,019, for example.

It has been further suggested in U.S. Pat. applications Ser. Nos. 826,297; 826,296 now abandoned; and 826,289 now U.S. Pat. No. 3,679,419, each filed on May 20, 1969; to use as light-sensitive compounds in such copying materials, mixed condensation products of condensable diazonium salts, active carbonyl compounds and non-light-sensitive condensable compounds.

The known copying layers yield planographic printing plates of medium printing runs on supports such as aluminum, zinc, and copper.

It is desirable to further increase the printing run which can be achieved with such printing plates. For this purpose, it is particularly necessary for the parts of the copying layer remaining on the support after exposure and development to have a good adhesion and good oleophilic properties.

Furthermore, it is generally desirable to improve the storability of the known copying materials of the mentioned kind in the unexposed state, particularly at higher temperatures and water content in the air, as they occur in tropical countries, for example.

The known diazo-based copying materials, with the use of an epoxide resin or another resin as the binder, meet these requirements only partially or have the disadvantage that the unexposed layer parts, particularly in the fine screened parts of the image areas, are insufficiently removed during development.

A suitable developer should easily remove the unexposed layer parts, but should not attack at all or attack as little as possible the image areas during thorough cleaning of the screen recesses. Insufficient cleaning or deposition of already removed resin particles in the fine screen recesses leads to tone value changes of the printing forms obtained, which are then useless for preparing prints of high quality.

The present invention provides a negative-working light-sensitive copying composition which is especially suitable for the production of printing plates and which, compared to known copying compositions or materials, has the same or a better light-sensitivity and storability, and is distinguished by particularly clean and rapid developability of the exposed copying layer, particularly in fine screened parts.

Planographic printing plates presensitized with such a copying composition are suitable for automatic production of printing forms in multistage processing apparatus, for example, and can yield a very great number of high-quality copies in an offset printing machine.

The present invention provides a light-sensitive copying composition containing a condensation product of a light-sensitive diazonium compound in admixture with at least one resin. The light-sensitive composition contains as a resin the reaction product of an organic acid free from olefinic double bonds with an epoxide resin.

The copying composition of the invention can be commercially used in the form of a solution or dispersion, e.g. as a so-called copying liquid, which is applied by the consumer himself to an individual support, e.g. for the production of etch resists and, after drying, is exposed and developed. In this manner, the composition may serve for the production of printed circuits and the like, for example. It also may be marketed in the form of a solid layer on a support, as a light-sensitive copying material for use in the photomechanical production of printing plates, particularly of planographic printing plates.

The copying composition of the invention contains, as the light-sensitive compound, a condensation product of an aromatic diazonium compound. Such condensation products are known and described in U. S. Pat. specifications Nos. 2,063,631; 2,667,415; 2,679,498; 3,050,502; 3,311,605; 3,163,633; 3,406,159; and 3,277,074. They are generally prepared by the condensation of a polynuclear aromatic diazonium compound, preferably of a substituted or unsubstituted diphenylamine-4-diazonium salt, with an active carbonyl compound, preferably formaldehyde, in a strongly acid medium.

U. S. Pat. applications Ser. Nos. 826,289; 826,296; and 826,297, filed May 20, 1969, describe additional such condensation products containing at least one unit each of the general types A(-D)$_n$ and B, which are connected by a bivalent intermediate member derived from a condensable carbonyl compound, and wherein A — is a radical of a compound containing at least two aromatic carbocyclic and/or aromatic heterocyclic nuclei, which compound is capable of condensation in at least one position with an active carbonyl compound in an acid medium, D — is a diazonium salt group attached to an aromatic carbon atom of A, $n$ — is an integer from 1 to 10, and B — is a radical of a compound free of diazonium groups, which compound is capable of condensation in at least one position with an active carbonyl compound in an acid medium.

These last-mentioned condensation products are preferred for use in the copying compositions of the invention.

Exemplary of compounds A-$N_2$X are 2,3',5-trimethoxy-diphenyl-4-diazonium chloride 2,4',5-triethoxy-diphenyl-4-diazonium chloride 4-[3-(3-methoxy-phenyl)-propylamino]-benzene diazonium sulfate 4-[N-ethyl-N-(4-methoxy-benzyl)-amino]-benzene diazonium chloride 4-[N-(naphthyl-(2)-methyl)-N-n-propyl-amino]-benzene diazonium sulfate 4-[N-(3-phenoxy-propyl)-N-methyl-amino]-2,5-dimethoxy-benzene diazonium tetrafluoroborate 4-[N-(3-phenylmercapto-propyl)-N-ethyl-amino]-2-chloro-5-methoxy-benzene diazonium chloride 4-[4-(3-methyl-phenoxy)-phenoxy]-2,5-dimethoxy-benzene diazonium chloride 4-(4-methoxy-phenylmercapto)-2,5-diethoxy-benzene diazonium chloride 2,5-diethoxy-4-phenoxy-benzene diazonium chloride 4-(3,5-dimethoxy-benzoylamino)-2,5-diethoxy-benzene diazonium hexafluorophosphate carbazole-3-diazonium chloride 3-methoxy-diphenyleneoxide-2-diazonium chloride diphenylamine-4-diazonium sulfate Important for the advantageous properties of the copying composition is its content of epoxide resins modified in a specific manner, as the binder component. The starting materials used for the production of these modified resins are epoxide resins which are polyethers still containing free hydroxyl and terminal epoxide groups and defined by general characteristics, such as hydroxyl and epoxide values or epoxy equivalent weights. The epoxide resins suitable as starting materials predominantly have two terminal epoxide groups, e.g. the amine epoxides and cycloaliphatic epoxide resins described in "Kunststoffe," volume 58(1968), No. 8, pages 565–571.

Further data concerning suitable epoxide resins are found, inter alia, in the first supplement of the "Encyclopedia of Chemical Technology," of Kirk and Othmer, published by The Interscience Encyclopedia, Inc., New York, 1957, pages 312 to 329; in the book "Epoxidverbindungen und Epoxidharze" of Paquin, published by Springer-Verlag, Berlin, Gottingen, Heidelberg, 1958, particularly pages 340 to 528, and in the book "Epoxidharzlacke" of Kurt Weigel, published by Wissenschaftliche Verlagsgemeinschaft M.B.H., Stuttgart, 1965. The most known representatives contain, as the basic units, condensation products from 2,2-bis-(4-hydroxyphenyl)-propane, also known as bisphenol A, and epichlorohydrin. They are commercially available under different trade names and represent glycidyl ethers of 2,2-bis-(4-hydroxyphenyl)-propane, in which ethers at least one hydroxy group of the glycidyl radical is not used for condensation. It is known from the application of these resins in the lacquer and casting resin fields that these resins can be modified or hardened by reactions, e.g. by esterification, at the free hydroxy groups and the terminal epoxide groups.

Numerous publications particularly suggest amines, acids, phenols, thiols, alcohols and also Lewis acids, such as borontrifluoride and the complexes thereof with ethers, alcohols, phenols and amines as the so-called hardeners for epoxide resins.

The epoxide resin reaction products used in accordance with the invention are produced by the reaction of the epoxide resins with organic acids which contain no cross-linkable and polymerizable groups, particularly no olefinic double bonds. The reaction products are distinguished by the fact that at least the major part of epoxide groups therein is cleaved with the formation of ester bonds. The best results are obtained with reaction products which contain practically no epoxide groups.

Reaction with an acid advantageously is performed at an elevated temperature, e.g. in the range from 120° to 150° C., and preferably in the presence of a catalyst. Suitable catalysts are particularly organic bases containing tertiary or quaternary nitrogen, such as pyridine, triethanol amine, N-methylmorpholine, and preferably benzyl trimethyl ammonium hydroxide.

Suitable acids are aliphatic, cycloaliphatic, aromatic, and heterocylic acids, e.g. carboxylic, sulfonic, and phosphonic acids. Carboxylic and sulfonic acids are particularly preferred because of their easy accessibility. The acids may be mono- and multivalent. Monovalent acids generally are preferred since they yield particularly clear and reproducible reaction products. Examples of suitable acids are acetic acid, oxalic acid, benzoic acid, salicylic acid, pyromellitic acid, and p-toluene sulfonic acid. Also suitable are, for example, propionic acid, glutaric acid, lactic acid, chloroacetic acid, phthalic acid, cyclohexylcarboxylic acid, phenyl phosphonic acid, methane sulfonic acid, and naphthalene disulfonic acid.

The reaction may be performed in the pure mixture of the mentioned components or in inert solvents of higher boiling points, such as glycol ethers, particularly in ethylene glycol monomethyl ether.

For the preparation of the sensitizing solution, it is possible to directly use the reaction mixture, or to employ the pure modified epoxide resins which are isolated by precipitation from the reaction solution by means of water and subsequent processing.

In accordance with the invention, particularly epoxide resins with low to medium molecular weights, i.e. in the range from about 300 to 3,000, are used as starting materials since, with increasing molecular weight, the adhesion to the support increases to such an extent that development of the exposed printing plate is difficult.

The quantitative ratio of light-sensitive compound to epoxide resin reaction product is variable, depending upon the intended use and the nature of the compounds used. Generally, it is between 10 : 1 and 1 : 20, preferably between 2 : 1 and 1 : 10 by weight.

In addition to the above-described epoxide resin reaction products, it is also possible to advantageously add to the copying composition of the invention various other resins, e.g. phenol resins, unmodified epoxide resins also of higher molecular weights, oil-modified alkyd resins, amine-formaldehyde resins, such as urea and melamine resins, polyamides, polyurethanes, polyvinyl resins, acryl resins, polyvinyl acetals, polyvinyl chloride, polyester, nitrocellulose, and the like, the ratio of epoxide resin reaction product to other resins ranging between 10 : 1 and 1 : 10, preferably from 1 : 1 to 1 : 4 by weight. The total quantity of binder advantageously is in the range indicated above for the epoxide resin reaction product.

It is possible to additionally add dyestuffs, plasticizers, wetting agents, and indicators to the copying compositions of the invention. All additives should be so selected that they are compatible with the other layer constituents and, furthermore, absorb as little as possible in the absorption range of the light-sensitive compound.

In this manner it is possible, depending upon the intended use and the layer thickness desired, to prepare copying compositions which can be adjusted to specific properties by the combination of binder and light-sensitive compound in a suitable ratio.

Of the listed additional resins, polyvinyl acetal resins in mixtures with epoxide resin reaction products are particularly preferred for the production of the copying composition of the invention.

Presensitized planographic printing plates which have only thin layers of about 1 $g/m^2$ of this copying composition have excellent copying and printing properties, such as a high light-sensitivity, good developability with good developer resistance, excellent storability and a very long printing run with an image reproduction of the correct tone value.

Suitable solvents for use in the industrial production of these copying layers, particularly of the preferred copying layers with water-insoluble diazo mixed condensates as the light-sensitive compound, are primarily the liquids generally known as good solvents, such as alcohols, amides, and ketones; preferred are ethylene glycol monomethyl ether, ethylene glycol monoethyl ether, ethylene glycol monoisopropyl ether, dimethyl formamide, diacetone alcohol and butyrolactone. For achieving uniform layers, ethers and esters, such as dioxane, tetrahydrofuran, butyl acetate, and ethylene glycol methyl ether acetate are often added to these solvents. For the preparation of the storable fluid copying composition, the same solvents and solvent combinations are principally used.

For the production of the light-sensitive copying material of the invention for the production of printing plates, the copying composition, dissolved in one or more of the listed solvents, is applied to a support suitable for reprographic purposes and the applied solution is dried. Coating may be performed by whirl-coating, spraying, immersion, application by means of rollers or by means of a liquid film and depends upon the properties of the material to be coated.

Various materials are suitable as supports, such as paper, zinc, magnesium, aluminum, chromium, copper, brass, steel, and multi-metal foils or plastic films. For the production of planographic printing plates, there is preferably used aluminum roughened mechanically or chemically or by means of an electric current and/or anodized aluminum which, prior to sensitization, preferably has been pretreated with phosphonic acids or derivatives of phosphonic acids according to German Pat. specification No. 1,160,733, with alkali silicate according to German Pat. specification No. 907,147, with zirconium or titanium hexahalides according to German Pat. specifications Nos. 1,183,919, and 1,192,666, or with monomeric and polymeric carboxylic acids.

The use of a layer colored by the addition of dyestuffs is recommended for clear differentiation of the sensitized from the unsensitized side in the case of monolaterally presensitized plates, for exact judgment of development and the quality of the printing form, and may save subsequent inking up with greasy ink.

By the addition of suitable indicator dyestuffs, it is possible to achieve a color contrast between the exposed and unexposed areas immediately after exposure to light.

Processing of the printing plates presensitized with the copying composition of the invention into the form ready for printing is performed in the usual manner. The plate is exposed under an original to a light source emitting rays in the ultraviolet range of the spectrum. Whereas the layer becomes hardened and substantially insoluble in the areas where the light strikes, the unexposed, still soluble areas of the layer are removed by immersion and/or swabbing with a suitable developer. After development, the planographic printing form thus produced may be inked up with greasy ink and provided with a preserving agent, such as gum arabic.

Preferred developers are aqueous solutions which, up to about one third of their volume, may contain organic solvents, e.g. lower aliphatic alcohols. The solutions generally furthermore contain wetting agents, inorganic salts, acids, and the like. Preferably used are weakly acid developer solutions.

The light-sensitive copying material of the invention has a very good light-sensitivity and storability also at higher temperatures and water content of the air. Furthermore, it has a good developer resistance, whereas the unexposed areas of the copying layer can be removed extraordinarily rapidly and cleanly by aqueous non-inflammable developers. The printing forms obtained yield a very great number of printed copies, the screen originals being reproduced with correct tone value. By varying the additions of other resins, particularly in the use of the diazo mixed condensates as light-sensitive compounds, the properties of the copying materials for specific purposes of use, e.g. for the automatic production of printing forms in multi-stage processing apparatus, may be adjusted in a wide range.

The light-sensitive copying materials of the invention are particularly used for the production of planographic printing plates. After development, they also may be converted by etching into relief or intaglio printing forms or into multi-metal printing forms. It is also possible to use the copying compositions for the production of printed circuits, of screen printing forms, and the like.

The following examples illustrate preferred embodiments of the copying compositions of the invention. If not stated otherwise, percentages are by weight. One part by weight is 1 g if 1 $cm^3$ is selected as one part by volume.

EXAMPLE 1

An aluminum plate of a thickness of 0.3 mm was mechanically roughened by brushing, immersed for 3 minutes at 70° C. in a 20 per cent trisodium phosphate solution, rinsed with water, treated for 15 seconds with 70 per cent nitric acid, rinsed again with warm water, pretreated for 3 minutes in 2 per cent sodium silicate solution at 90° C., and then briefly rinsed with water and dried.

The pretreated aluminum plate was coated with the following solution:

0.7 part by weight of the diazo mixed condensate described below,
3.5 parts by weight of 85 per cent phosphoric acid,
3.0 parts by weight of the modified epoxide resin described below,
60.0 parts by weight of ethylene glycol monomethyl ether,
30.0 parts by weight of tetrahydrofuran, and
10.0 parts by weight of butyl acetate.

The modified epoxide resin used was prepared as follows:

50 g of an epoxide resin from bisphenol A and epichlorohydrin with an epoxy equivalent weight of 876, a hydroxyl value of 0.34, a melting point of 100° C., and a molecular weight between 1,000 and 2,000 (Epikote 1004 of Shell Chemical Co.) were heated with reflux for 5 hours with 7.9 g of salicyclic acid in 100 ml of ethylene glycol monomethyl ether and 0.6 ml of benzyl trimethyl ammonium hydroxide. The reaction mixture was poured into ice water, the separated product was dissolved in an organic solvent, and the solution was washed, dried, filtered, and evaporated.

The diazo mixed condensate was prepared as follows:

32.3 parts by weight of 3-methoxy-diphenylamine-4-diazonium sulfate were dissolved in 120 parts by weight of 86 per cent phosphoric acid. 12.9 parts by weight of 4,4'-bis-methoxymethyl-diphenylether were then slowly added and the mixture was condensed for 21 hours at 40° C. The condensation mixture was dissolved in water and the condensation product was separated as the chloride by the addition of 18 per cent hydrochloric acid. The chloride was purified by dissolving it in water and reprecipitating it with hydrochloric acid. The condensate was finally dissolved again in water and separated from this solution as the salt of naphthalene-2-sulfonic acid. The precipitate was separated, washed and dried. Yield: 35 parts by weight (C67.0 %, N 7.2 %, S 5.6 %, P 0.18 %, Cl 0.21 %; atomic ratio C:N:S 32.6:3:1).

The aluminum plate presensitized with the above solution was dried and, for the production of the printing form, exposed for 45 seconds under a photographic negative to an 8,000 watt xenon lamp of a copying apparatus. The exposed layer was developed by swabbing with a solution of 5.0 g of $MgSO_4 \cdot 7H_2O$,
0.5 g of non-ionic wetting agent,
20.0 g of n-propanol, and
75.0 g of distilled water, and was then inked up with greasy ink. The plate was then ready for printing.

Comparable printing plates are obtained when using, instead of Epikote 1004, an epoxide resin from bisphenol A and epichlorohydrin of a melting point of 70° C., an epoxy equivalent weight of 459, a hydroxyl value of about 0.3, and a molecular weight below 1,000 (Epikote 1001).

EXAMPLE 2

A 0.3 mm thick aluminum plate electrolytically roughened and anodized was thoroughly freed from anode mud by washing with water under a pressure of 70 to 80 kg/cm², subsequently dried, immersed for 3 minutes in a 1 per cent potassium hexafluorotitanate solution of 70° C., washed with water, treated for 3 minutes with 0.5 per cent citric acid, washed again with water, and dried.

The aluminum plate was coated with the following solution:

0.7 part by weight of the diazo mixed condensate described below,
3.5 parts by weight of 85 percent phosphoric acid,
3.0 parts by weight of the modified epoxide resin described below,
70.0 parts by weight of ethylene glycol monomethyl ether,
20.0 parts by weight of tetrahydrofuran, and
10.0 parts by weight of butyl acetate.

The diazo mixed condensate was prepared as follows:

64.6 parts by weight of 3-methoxy-diphenylamine-4-diazonium sulfate were dissolved in 340 parts by weight of 85 per cent phosphoric acid, 77.4 parts by weight of 4,4'-bis-methoxymethyl-diphenylether were then dropwise added and the mixture was condensed for 4½ hours at 40° C. After dilution with 500 parts by volume of water, the chloride of the condensation product was precipitated by the addition of 440 parts by volume of semi-concentrated hydrochloric acid. The chloride of the condensate was again dissolved in water, again precipitated in the same manner, and finally the mesitylene sulfonate of the diazo compound was separated by means of the sodium salt of mesitylene sulfonic acid as a precipitate sparingly soluble in water. Yield: 126 parts by weight (C 69.2 %, N 4.9 %, S 4.0 %, $OCH_3$ 4.9 %; atomic ratio 49.5 : 3 : 1.07 : 1.35).

For the production of the modified epoxide resin, 50 g of an epoxide resin from bisphenol A and epichlorohydrin with an epoxy equivalent weight of 500, a softening point of about 70° C., and a molecular weight below about 1,000, (Beckopox 37 - 301 of Reichhold-Albert-Chemie AG) were heated for 5 hours to 150° C. with 25.9 g of pyromellitic acid and 1.1 ml of benzyl trimethyl ammonium hydroxide. The reaction product was used without further purification.

The production of a printing form from this presensitized planographic printing plate was performed as in Example 1 but the developer solution additionally contained 1 per cent of phosphoric acid. Comparable presensitized plates were obtained when using, instead of the epoxide resin Beckopox 37 - 301, the resins Beckopox 37 - 139, 37 - 151 or 37 - 300 or, instead of benzyltrimethyl ammonium hydroxide, triethanol amine as the catalyst.

EXAMPLE 3

An electrolytically roughened and anodized aluminum plate was pretreated as in Example 2 but with a solution of potassium hexafluorozirconate instead of potassium hexafluorotitanate and coated with the following solution:

0.7 part by weight of the diazo mixed condensate described below,
3.4 parts by weight of 85 percent phosphoric acid,
3.0 parts by weight of a modified epoxide resin prepared similarly as in Example 1 from 50 g of Epikote 1001, 18.2 g of p-toluenesulfonic acid, and 1.1 ml of benzyltrimethyl ammonium hydroxide in 100 ml of ethylene glycol monomethyl ether.
70.0 parts by weight of ethylene glycol monomethyl ether,
20.0 parts by weight of tetrahydrofuran, and
10.0 parts by weight of butyl acetate.

The diazo mixed condensate was prepared as follows:

32.3 parts by weight of 3-methoxy-diphenylamine-4-diazonium sulfate were dissolved in 170 parts by weight of 85 per cent phosphoric acid, 25.8 parts by weight of 4,4'-bis-methoxymethyl-diphenylether were dropwise added and the mixture was condensed for 5 hours at 40° C. After dilution with 250 parts by volume of water, the chloride of the condensation product was precipitated by the addition of 220 parts by volume of semi-concentrated hydrochloric acid. The condensate was again dissolved in water and the mesitylene sulfonate of the diazo compound was obtained as a precipitate sparingly soluble in water by means of the sodium salt of mesitylene sulfonic acid. Yield: 53 parts by weight (C 67.2 %, N 6.3 %, S 4.6 %; atomic ratio 37.3 : 3 : 0.96).

The printing form production was the same as in Example 1 but with a developer solution containing no n-propanol.

In all cases, presensitized printing plates with very good properties were obtained which were distinguished by extraordinarily rapid and clean developability and long printing runs and were superior, particularly to printing plates carrying unmodified epoxide resins as binders, by a storability increase of two to six times at 100° C. or at an increased air humidity.

In the same manner, additional presensitized printing plates were produced and processed into printing forms but, instead of Epikote 1001, the epoxide resins Epikote 812, 828, 834, 1004, and 1007 were used. Similarly good results were achieved.

EXAMPLE 4

An electrolytically roughened and anodized aluminum plate was immersed for 1 minute in a hot bath at 60° C. of 0.3 per cent by weight of polyvinyl phosphonic acid in water, then washed with water under a pressure of 70 to 80 kg/cm$^2$, dried and coated with the following solution:

0.7 part by weight of the diazo mixed condensate described in Example 3,
3.4 parts by weight of 85 percent phosphoric acid,
3.0 parts by weight of a modified epoxide resin prepared, as in Example 1, from 50 g of Epikote 1001, 12.8 g of benzoic acid, and 1.1 ml of benzyl trimethyl ammonium hydroxide in 100 ml of ethylene glycol monomethyl ether,
0.44 part by weight of finely grounded Heliogen Blue G (Colour Index 74,100)
62.0 parts by weight of ethylene glycol monomethyl ether,
30.0 parts by weight of tetrahydrofuran, and
8.0 parts by weight of ethylene glycol methyl ether acetate.

The production of a printing form from this presensitized planographic printing plate was the same as in Example 2 but the following developer solution was used:

2.8 parts by weight of $Na_2SO_4 \cdot 10\ H_2O$,
2.8 parts by weight of $MgSO_4 \cdot 7\ H_2O$,
0.9 part by weight of orthophosphoric acid (85 percent),
0.08 part by weight of phosphorous acid,
1.6 parts by weight of non-ionic wetting agent,
10.0 parts by weight of benzyl alcohol,
20.0 parts by weight of n-propanol, and
60.0 parts by weight of water.

The presensitized plates were blue-colored and yielded a blue-colored image rich in contrast after development. Comparable sensitized planographic printing plates were obtained by using, instead of Epikote 1001, the other Epikote types mentioned in Example 3, in an analogous method.

EXAMPLE 5

An aluminum support as in Example 4 pretreated not with polyvinyl phosphonic acid but with sodium silicate at 90° C., was coated with the following solution:

0.7 part by weight of the diazo mixed condensate described in Example 3,
3.4 parts by weight of 85 percent phosphoric acid,
3.0 parts by weight of an epoxide resin reacted not with benzoic acid but with 25.9 g of pyromellitic acid,
0.67 part by weight of Ceres Blue GN (Color Index II, 61,520),
70.0 parts by weight of ethylene glycol monomethyl ether,
20.0 parts by weight of tetrahydrofuran, and
10.0 parts by weight of butyl acetate.

For the production of a printing form, the presensitized planographic printing plate was treated as in Example 1. As in Example 4, colored copies rich in contrast were obtained after development.

When using Epikote 1004 instead of Epikote 1001 for the preparation of the modified epoxide resin, planographic printing plates with very similar properties were obtained.

EXAMPLE 6

An aluminum support pretreated as in Example 2 was coated with the following solution:

0.7 part by weight of the diazo mixed condensate described in Example 3,
3.4 parts by weight of 85 percent phosphoric acid,
3.0 parts by weight of the modified epoxide resin described below,
0.05 part by weight of metanil yellow,
70.0 parts by weight of ethylene glycol monomethyl ether,
20.0 parts by weight of tetrahydrofuran, and
10.0 parts by weight of butyl acetate.

The epoxide resin used was prepared as follows:

50 g of an epoxide resin with an epoxide value of 0.21, a hydroxyl value of 0.32, and a melting point of about 70° C. (Witolen 20 of Chemische Werke Witten GmbH), were reacted with 12.9 g of oxalic acid and 1.1 ml of benzyl trimethyl ammonium hydroxide in 100 ml of ethylene glycol monomethyl ether.

A printing form was produced from this presensitized planographic printing plate as in Example 2.

After exposure, a purple-colored image rich in contrast was obtained in the areas struck by light.

EXAMPLE 7

An aluminum plate of a thickness of 0.1 mm was mechanically roughened by brushing and provided with a boehmite layer by immersing it for 10 minutes in a 2 per cent ammonia solution at 80° C. It was then immersed for 10 seconds in a bath at 70° C. containing 0.5 per cent by weight of polyvinyl phosphonic acid in water, and dried. The thus pretreated surface of the aluminum plate was then coated with the following solution:

0.75 part by weight of a condensate from 3.3 parts by weight of p-formaldehyde and 23 parts by weight of diphenylamine-4-diazonium chloride in 42 parts by weight of 85 percent phosphoric acid, used as crude condensate, i.e. without separation from the phosphoric acid,
3.0 parts by weight of the epoxide resin reaction product described in Example 4,
0.3 part by weight of phenolphthalein, and
100.0 parts by weight of ethylene glycol monomethyl ether.

A printing form was produced as described in Example 1. After exposure, a strong red coloration could be observed in the areas struck by light.

With the same coating solution but containing the corresponding unmodified epoxide resin, no usable printing forms could be produced.

Similarly good results are obtained by using, instead of the condensate of diphenylamine-4-diazonium chloride and formaldehyde, the corresponding condensate of 3-methoxy-diphenylamine-4-diazonium chloride and formaldehyde.

EXAMPLE 8

The cleaned copper surface of a bimetal plate of aluminum and copper was whirl-coated with a solution of the following composition:

4.5 parts by weight of the diazo mixed condensate described in Example 3,
0.75 part by weight of the epoxide resin reaction product described in Example 4,
0.3 part by weight of Ceres Blue GN (Color Index 61,520),
5.0 parts by weight of 85 percent phosphoric acid,
60.0 parts by weight of ethylene glycol monomethyl ether,
10.0 parts by weight of butyl acetate, and
30.0 parts by weight of tetrahydrofuran.

After exposure under a negative, the plate was developed in known manner with an acid solution and the copper bared in the non-image areas was etched away by means of an etching solution (containing 45 percent of $Fe(NO_3)_2$ and 5 per cent of copper acetate in water) until the aluminum beneath was clearly visible. The wet plate was then wiped over with 3 per cent sulfuric acid and inked up with greasy ink, the ink being accepted in the image areas and repelled in the bared aluminum areas. Very long printing runs could be achieved with this printing form.

It will be obvious to those skilled in the art that many modifications may be made within the scope of the present invention without departing from the spirit thereof, and the invention includes all such modifications.

What is claimed is:

1. A light-sensitive copying compositions comprising, as the light-sensitive compound, a condensation product of a polynuclear aromatic diazonium compound with an active carbonyl compound and, in admixture with said condensation product, the reaction product of a monovalent organic acid free of olefinic double bonds and selected from the group consisting of carboxylic acids, sulfonic acids, and phosphonic acids, and an epoxide resin, the latter being a polyether containing free hydroxyl and terminal epoxide groups, in which reaction product substantially all epoxide groups are cleaved.

2. A copying composition according to claim 1 in which the epoxide resin has a molecular weight in the range of about 300 to 3,000.

3. A copying composition according to claim 1 in which the epoxide resin is derived from bisphenol A and epichlorohydrin.

4. A copying composition according to claim 1 in which the condensation product and the reaction product are present in a weight ratio of about 2 : 1 to 1 : 10.

5. A copying composition according to claim 1 including another resin in the quantity of 1 to 4 parts by weight per part of reaction product.

6. A copying composition according to claim 5 in which the other resin is a polyvinyl acetal.

7. A copying composition according to claim 1 in which the monovalent acid is benzoic acid.

8. A copying composition according to claim 1 in which the monovalent acid is salicyclic acid.

9. A copying composition according to claim 1 in which the monovalent acid is p-toluene sulfonic acid.

10. A copying composition according to claim 1 in which the monovalent acid is pyromellitic acid.

11. A light-sensitive copying composition comprising as the light-sensitive compound a condensation product comprising repeating units of each of the general types $$A\text{-}N_2X \text{ and } B$$

which are linked by methylene groups, in which

A is a radical of a compound of one of the general formulae $(R_1-R_3-)_pR_2-N_2X$ and 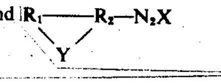

wherein $R_1$ is an arylene group of the benzene or naphthalene series $R_2$ is a phenylene group $R_3$ is a single bond or one of the groups $$-(CH_2)_q-NR_4-$$
$$-O-(CH_2)_r-NR_4-$$
$$-S-(CH_2)_r-NR_4-$$
$$-O-R_5-O-$$
$$-O-$$
$$-S- \text{ or}$$
$$-CO-NR_4-$$

the left-hand free valence of the specified groups is attached to $R_1$ and the right-hand free valence is attached to $R_2$ wherein $q$ is a number from 0 to 5

$r$ is a number from 2 to 5

$R_4$ is selected from the group consisting of hydrogen, alkyl with 1 to 5 carbon atoms, aralkyl with 7 to 12 carbon atoms, and aryl with 6 to 12 carbon atoms, $R_5$ is an arylene group having 6 to 12 carbon atoms -Y- is one of the groups -NH-, and -O-

X is the anion of the diazonium compound, and p is a number from 1 to 3, and

B is a radical of a compound free of diazonium groups selected from the group consisting of aromatic amines, phenols, thiophenols, phenol ethers, aromatic thioethers, aromatic heterocyclic compounds, aromatic hydrocarbons and organic acid amines, which condensation product contains, on the average, about 0.01 to 50 B units per unit of $A\text{-}N_2X$ and, in admixture with said condensation product, the reaction product of a monovalent organic acid free of olefinic double bonds and selected from the group consisting of carboxylic acids, sulfonic acids, and phosphonic acids, and an epoxide resin the latter being a polyether containing free hydroxyl and terminal epoxide groups, in which reaction product substantially all epoxide groups are cleaved.

12. A copying composition according to claim 11 in which the epoxide resin has a molecular weight in the range of about 300 to 3,000.

13. A copying composition according to claim 11 in which the epoxide resin is derived from bisphenol A and epichlorohydrin.

14. A copying composition according to claim 11 in which the condensation product and the reaction product are present in a weight ratio of about 2 : 1 to 1 : 10.

15. A copying composition according to claim 11 including another resin in a quantity of 1 to 4 parts by weight per part of reaction product.

16. A copying composition according to claim 15 in which the other resin is a polyvinyl acetal.

17. A copying composition according to claim 11 in which the monovalent acid is benzoic acid.

18. A copying composition according to claim 11 in which the monovalent acid is salicylic acid.

19. A copying composition according to claim 11 in which the monovalent acid is p-toluene sulfonic acid.

20. A copying composition accoding to claim 11 in which the monovalent acid is pyromellitic acid.

21. A light-sensitive reproduction material comprising a support having a light-sensitive layer thereon, the latter including, as the light-sensitive compound, a condensation product of a polynuclear aromatic diazonium compound with an active carbonyl compound and, in admixture with said condensation product, the reaction product of a monovalent organic acid free of olefinic double bonds and selected from the group consisting of carboxylic acids, sulfonic acids, and phosphonic acids, and an epoxide resin the latter being a polyether containing free hydroxyl and terminal epoxide groups, in which reaction product substantially all epoxide groups are cleaved.

22. A reproduction material according to claim 21 including an intermediate adhesive layer obtained by treatment of the support with a phosphonic acid or a phosphonic acid derivative, with an alkali silicate or with a zirconium or titanium hexahalide.

23. A reproduction material according to claim 21 in which the support is suitable for planographic printing.

24. A reproduction material according to claim 21 in which the support is pretreated aluminum.

25. A light-sensitive reproduction material comprising a support having a light-sensitive layer thereon, the latter including as the light-sensitive compound, a condensation product comprising repeating units of each of the general types $$A\text{-}N_2X \text{ and } B$$

which are linked by methylene groups, in which

A is a radical of a compound of one of the general formulae $$(R_1—R_3—)_pR_2—N_2X \text{ and } R_1\text{——}R_2—N_2X \text{ (with } R_1 \text{ and } R_2 \text{ bridged by } Y)$$

wherein $R_1$ is an arylene group of the benzene or naphthalene series $R_2$ is a phenylene group $R_3$ is a single bond or one of the groups $-(CH_2)_q-NR_4-$ $-O-(CH_2)_r-NR_4-$ $-S-(CH_2)_r-NR_4-$ $-O-R_5-O-$

-O-

-S- or $-CO-NR_4-$ the left-hand free valence of the specified groups is attached to $R_1$ and the right-hand free valence is attached to $R_2$ wherein

*q* is a number from 0 to 5,

*r* is a number from 2 to 5

$R_4$ is selected from the group consisting of hydrogen, alkyl with 1 to 5 carbon atoms, aralkyl with 7 to 12 carbon atoms, and aryl with 6 to 12 carbon atoms, $R_5$ is an arylene group having 6 to 12 carbon atoms -Y- is one of the groups -NH-, and -O-

X is the anion of the diazonium compound, and p is a number from 1 to 3, and

B is a radical of a compound free of diazonium groups selected from the group consisting of aromatic amines, phenols, thiophenols, phenol ethers, aromatic thioethers, aromatic heterocyclic compounds, aromatic hydrocarbons and organic acid amides, which condensation product contains, on the average, about 0.01 to 50 B units per unit of $A\text{-}N_2X$ and, in admixture with said condensation product, the reaction product of a monovalent organic acid free of olefinic double bonds and selected from the group consisting of carboxylic acids, sulfonic acids, and phosphonic acids, and an epoxide resin the latter being a polyether containing free hydroxyl and terminal epoxide groups, in which reaction product substantially all epoxide groups are cleaved.

26. A reproduction material according to claim 25 in which the support is suitable for planographic printing.

27. A reproduction material according to claim 25 in which the support is pretreated aluminum.

28. A reproduction material according to claim 25 including an intermediate adhesive layer obtained by treatment of the support with a phosphonic acid or a phosphonic acid derivative, with an alkali silicate or with a zirconium or titanium hexahalide.

* * * * *